(12) United States Patent
Kochergin

(10) Patent No.: US 8,501,621 B2
(45) Date of Patent: Aug. 6, 2013

(54) METHOD OF FABRICATION OF THE MEMRISTIVE DEVICE

(75) Inventor: Vladimir Kochergin, Christiansburg, VA (US)

(73) Assignee: MicroXact, Inc., Christiansburg, VA (US)

( * ) Notice: Subject to any disclaimer, the term of this patent is extended or adjusted under 35 U.S.C. 154(b) by 80 days.

(21) Appl. No.: 13/358,541

(22) Filed: Jan. 26, 2012

(65) Prior Publication Data

US 2012/0202334 A1  Aug. 9, 2012

Related U.S. Application Data

(60) Provisional application No. 61/437,655, filed on Jan. 30, 2011.

(51) Int. Cl.
*H01L 21/20* (2006.01)

(52) U.S. Cl.
USPC ............. 438/658; 257/E21.004; 365/189.011

(58) Field of Classification Search
USPC ....... 438/658; 257/5, 572, E21.004, E45.003; 365/189.011
See application file for complete search history.

(56) References Cited

U.S. PATENT DOCUMENTS

| | | | |
|---|---|---|---|
| 2010/0243983 A1* | 9/2010 | Chiang et al. ................ | 257/4 |
| 2011/0182108 A1* | 7/2011 | Williams et al. ............. | 365/148 |
| 2011/0248381 A1* | 10/2011 | Tong et al. .................... | 257/537 |

* cited by examiner

*Primary Examiner* — Caridad Everhart

(57) ABSTRACT

Three-dimensionally spatially localized artificial filament in the active layer of the memristive device formed by means of ion implantation through the top electrode structure provide the means to achieve high repeatability and high reliability of the memristive devices, leading to significantly improved manufacturing yield. The memristive devices fabricated according to the disclosed method of fabrication can be used in data storage, signal processing and sensing applications.

6 Claims, 2 Drawing Sheets

METHOD OF FABRICATION OF THE MEMRISTIVE DEVICE

CROSS-REFERENCES TO RELATED APPLICATIONS

Provisional patent, Memristive Device and Method of Fabrication of the Memristive Device, application #61437655

STATEMENT REGARDING FEDERALLY SPONSORED RESEARCH OR DEVELOPMENT

This invention was made with Government support under contract FA9550-10-C-0083 awarded by U.S. Air Force Office of Scientific Research. The Government has certain rights in the invention.

FIELD OF THE INVENTION

The present invention relates to memristor device and method of manufacturing of the memristive device with improved reliability and repeatability. In more detail the present invention is related to improvement of reliability and repeatability of memristive devices by utilizing artificial filament in an oxide layer formed by the method selected by the group consisted of ion implantation, ion exchange and electron irradiation.

BACKGROUND OF THE INVENTION

Currently, the most typical platforms for signal processing are graphics processing units (GPU), digital signal processors (DSP), field programmable gate arrays (FPGA), and some highly specialized integrated circuits such as artificial neuromorphic networks. However, even these dedicated computational platforms cannot follow the increasing demand for high performance signal processing [D. B. Strukov and K. K. Likharev, IEEE Trans. Nanotechnology, vol. 6, pp. 696-710, 2007]. It was recently suggested that memristive devices could form the basis of more efficient processors and circuits which will be able to meet future demand in high performance signal processing.

A memristor is a 2-terminal electrical circuit element that changes its resistance depending on the total amount of charge that flows through the device. A memristance naturally arises in thin-film semiconductors for which electronic and dopant equations of motion are coupled in the presence of an applied electric field [D. B. Strukov, et al., "The missing memristor found," Nature, vol. 453, pp. 80-83, 2008]. This property is common for nanoscale films and has been observed in a variety of material systems, e.g. transition metal oxides, perovskites, various superionic conductors composed of chalcogenides and metal electrodes, and organic polymer films (see, e.g., [G. Dearnaley, et al., "Electrical phenomena in amorphous oxide films," Rep. Prog. Phys., 33, 1129 (1970)], [R. Waser, et al., Advanced Materials, vol. 21, pp. 2632-2663 (2009)], [B. Strukov, in: Nanoelectronics and Photonics, Berlin: Springer, pp. 15-57, 2008], [K. K. Likharev, J. Nanoelectronics and Optoelectronics, vol. 3, pp. 203-230 (2008)]). While memristance has been observed experimentally for at least fifty years before it was recognized as such, it has now become interesting for a variety of digital and analog applications, especially because of the nonvolatility of a true memristor. These properties arise from the defining equations for memristive systems, i.e. $v = R(w,i) i$, and $dw/dt = f(w,i)$ where v is the voltage, i is the current, R is the instantaneous resistance and w is a state variable (or variables). The memristive device, when switched between its extreme ON and OFF states, can be thought of as a binary resistance switch. Yet, the memristor's true potential is utilized when it is used in analog regime, i.e. with continuous range of resistance states.

There is a wide range of material systems which exhibit memristive properties. This type of behavior has been experimentally observed in, for example: organic films (see, for a nonlimiting example, [B. Zhitenev, et al., Nature Nanotech., vol. 2, pp. 237-242 (2007)] and U.S. Pat. No. 7,443,711 "Non-volatile programmable impedance nanoscale devices" Issued to Duncan R. Stewart, et al., on Oct. 28, 2008) that contain charged dopants or molecules with mobile charged components; chalcogenides (see, e.g., [K. Terabe, et al., "Quantized conductance atomic switch," Nature, vol. 433, pp. 47-50 (2005)]) where switching was attributed to ion migration rather than a phase transition; and metal oxides (see, e.g., [Jameson, J. R. et al. Appl. Phys. Lett., vol. 91, pp. 112101 (2007)] and [A. Beck, et al., Appl. Phys. Lett. vol. 77, pp. 139-141 (2000)]), notably $TiO_2$ and various perovskites.

There are several problems preventing the practical applications of memristive devices at present, namely unrepeatability and unreliability of memristive devices. There are two main sources of these problems: 1) electroforming process, and 2) imperfection (roughness, variation in passivation state, etc.) of interfaces in the resistive switching process.

The least understood, and most problematic, step in the operation of metal oxide switches is the 'electroforming' process, a one-time application of high voltage or current (a necessary step in the "activation" of memristive devices) that produces a significant change in electronic conductivity. After electroforming process metal-oxide-metal (MOM) memristors exhibit a wide variance of IV characteristics. J. J. Yang et al., ["The mechanism of electroforming of metal oxide memristive switches." Nanotechnology 20, 215201 (2009)] experimentally demonstrated that electroforming of MOM switches is an electro-reduction and drift process during which oxygen vacancies are created and drift towards the cathode forming localized conducting channels in the oxide film. Simultaneously, $O^{2-}$ ions drift towards the anode and are discharged there, evolving $O_2$ gas and causing physical deformation of the junction. J. J. Yang et al further demonstrated that the problematic physical deformation can be reduced by shrinking the junction size to the nanoscale (100 nm or below) and further showed that the forming process can be minimized by restricting the insulating $TiO_2$ oxide to a very thin (few nm) layer in combination with thick but conductive oxide layer ($TiO_x$ layer).

Another critical source of unrepeatability and unreliability of memristive devices to date is associated with electrode/switching layer interface quality. Xia et al. [Nano Lett. 2010, 10, 2909-2914] suggested a process in which the two electrodes and the switching layer are being deposited in one step, without exposing the various layers to ambient. The key process in this approach is glancing angle deposition of layers, with which bottom and top electrodes can be deposited with the same photoresist pattern by properly aligning the pattern with respect to the direction of deposition. A variation of this fabrication concept was suggested by K. Michelakis et al. [Micro & Nano Letters, 2010, Vol. 5, Iss. 2, pp. 91-94]. It was shown that such an approach indeed provides more repeatable memristive devices, although the glancing angle deposition also resulted in higher surface roughness and more studies are needed to identify the extent of the improvement in reliability and repeatability of such a process.

U.S. patent application Ser. No. 11/542,986 "Electrically Actuated Switch" by S. R. Williams filed on Oct. 3, 2006 is teaching a memristive device ("electrically actuated switch" according to the terminology taught in this patent application), which comprises a first electrode, a second electrode, and an active region disposed in between. The active region comprises at least one primary active region comprising at least one material that can be doped or undoped to change its electrical conductivity, and a secondary active region comprising at least one material for providing a source/sink of ionic species that act as dopants for the primary active region(s). The deficiency of the memristive device according to U.S. patent application Ser. No. 11/542,986 is tight control of interface properties required to achieve reliability of such a device combined with poor repeatability of such a device associated with intrinsic poor repeatability of electroforming process required to activate such a memristive device.

U.S. Pat. No. 7,846,807 "Method for forming memristor material and electrode structure with memristance" by Tang et al. issued on Dec. 7, 2010 is teaching an ion implantation as a method of forming a doped layer within an oxide layer in memristive device. The ion implantation step is taught to be performed between the deposition of the oxide layer and forming a second electrode over the oxide layer. Such a method of fabrication of memristor device have following deficiencies: the ion implantation between oxide layer deposition and top electrode deposition may result in potentially non-ideal interface between the doped oxide layer and the top electrode (potentially resulting in high variability of such a memristive device), while intrinsic poor repeatability of electroforming process, which is required in such a method may result in poor repeatability of a such memristive device.

U.S. Pat. No. 7,985,962 "Memristive Device" by Bratkovski et al., filed on Dec. 23, 2008 and issued on Jul. 26, 2011 is teaching a memristive device includes a first electrode, a second electrode, and an active region disposed between the first and second electrodes. At least one of the first and second electrodes is a metal oxide electrode, with one method of forming metal oxide electrode being taught as an ion implantation. The memristive device according to the patent application may have similar deficiencies to previously discussed prior art memristive devices.

U.S. patent application Ser. No. 12/753,715 "Programmable Crosspoint Device with an Integral Diode" by J. Yang et al. filed on Apr. 2, 2010 is teaching a programmable crosspoint device with an integral diode, said device includes a first crossbar, a second crossbar, a metallic interlayer, and a switching oxide layer interposed between the first crossbar and the metallic interlayer. A method for forming a programmable crosspoint device with an integrated diode is also provided, and ion implantation is listed as one of the methods that can be used to provide a desired concentration of dopants in the switching oxide layer. However, the method of fabrication of the memristive device according to this patent application is expected to have similar deficiencies to reviewed above inventions of unreliability and unrepeatability due to imperfect interfaces and required electroforming process.

U.S. patent application Ser. No. 13/142581 "Memristive Transistor Memory" by D. Strukov et al. filed on Jan. 30, 2009 is teaching a memory device that includes a semiconductor wire including a source region, a drain region, and a channel region between the source region and the drain region. A gate structure that overlies the channel region includes a memristive portion and a conductive portion overlying the memristive portion. It further teaches doping source/drain regions in the semiconductor wires using the gate wires to mask the implanting. However, this application does not specifically address the issues of nonrepeatibility and unreliability of memristors due to nonperfect interfaces and electroforming process.

U.S. patent application Ser, No. 13/142,583 "Controlled Placement of Dopants in Memristor Active Regions" by N. J. Quitoriano et al., field on Jan. 26, 2009 is teaching various embodiments of the reconfigurable memristor devices. In one aspect, a memristor device comprises an active region sandwiched between a first electrode and a second electrode. The active region including a non-volatile dopant region selectively formed and positioned within the active region, and one of the taught methods of forming such a region is by ion implantation. However, again, the memristor device according to the referenced patent application are not expected to be fully solved, since the suggested implantation profile was uniform in parallel to the wafer direction (thus require electroforming process).

U.S. patent application Ser. No. 13/130,815 "Multilayer Memristive Devices" by W. Tong et al., filed on Jan. 20, 2009 is teaching a multilayer memristive device that includes a first electrode; a second electrode; a first memristive region and a second memristive region which created by directional ion implantation of dopant ions and are interposed between the first electrode and the second electrode; and mobile dopants which move within the first memristive region and the second memristive region in response to an applied electrical field. While this invention provides the means to localize the ionic channel in one dimension (into a possibly narrower than that width of the top electrode), the absence of localization of the ionic channel (or filament, in other terminology) into perpendicular direction is expected to still result in substantial level of nonrepeatability and possibly non-reliability of memristive devices designed/fabricated according to the U.S. patent application Ser. No. 13/130,815.

U.S. patent application Ser. No. 13/142,504 "Electrically Actuated Device" by M. D. Pickett et al. filed on Jun. 28, 2011, which is a continuation of application No. PCT/US09/32496, filed on Jan. 29, 2009 is teaching an electrically actuated device that includes a first electrode and a second electrode crossing the first electrode at a non-zero angle, thereby forming a junction therebetween. A material is established on the first electrode and at the junction. At least a portion of the material is a matrix region. A current conduction channel extends substantially vertically between the first and second electrodes, and is defined in at least a portion of the material positioned at the junction. The current conduction channel has a controlled profile of dopants therein. According to some of the embodiments of this patent application the current conduction channel is being fabricated by ion implantation through the mask formed by the top electrode with possible post-implantation annealing to allow controlled diffusion of the dopants into the area shadowed by the top electrode line. However, similarly to the case of U.S. patent application Ser. No. 13/130,815 reviewed above, the efficient two-dimensional localization of the conduction channel is not straightforwardly achievable with such a method.

To summarize, while variations upon cycling the device and yield problems associated with memristive device fabrication were identified and some progress was made in overcoming each of these problems independently, no fabrication process has been suggested/demonstrated to date that would be capable of solving both these issues at the same time.

SUMMARY OF THE INVENTION

It is an object of the present invention to provide a new fabrication method of memristive devices that will improve repeatability and reliability of memristive devices to the level sufficient for practical applications.

The method of formation of memristive device according to the present invention is based on the formation of an artificial filament, a three-dimensionally spatially localized sub-micrometer-sized doped region, in an active layer (for a non-limiting example, in an oxide layer sandwiched between top and bottom electrodes) by ion implantation process through the top electrode by using the masking layer.

According to the first embodiment of the present invention, a method of forming the memristive device on the substrate comprising:

Establishing the first electrode on at least a portion of the substrate;
Establishing the material on the at least the portion of the first electrode;
Establishing the second electrode on at least a portion of the material,
Establishing a mask layer on the top of at least the portion of the second electrode with at least one opening over the portion of the junction region;
Implanting a predetermined doping species into a portion of the material that is unmasked by the mask layer thus forming mobile species, thereby forming an artificial filament;
Removing the mask layer; and
Annealing the junction region, thereby activating the mobile species.

According to the first aspect of the present embodiment, prior to implanting, the material is essentially undoped or has low concentration of dopants, and wherein subsequent to implanting, the doping species are doping the material to form the mobile species and thus higher doped and higher conducting spatially-localized region of the material that thereby form an artificial filament According to the second aspect of the present embodiment, prior to implanting, the material contains dopants, and wherein subsequent to implanting, the mobile species passivates at least some of the dopants in the material to form less doped and less conducting region around the spatially-localized region of the material with higher concentration of dopants that thereby form an artificial filament.

According to the second embodiment of the present invention, a method of forming the memristive device on the substrate comprising:

Establishing the first electrode on at least a portion of the substrate;
Establishing the material on the at least the portion of the first electrode;
Establishing the second electrode material on at least a portion of the material,
Establishing a mask layer on the top of at least the portion of the second electrode material with at least one opening over the portion of the junction region;
Implanting a predetermined doping species into a portion of the material that is unmasked by the mask layer thus forming mobile species, thereby forming an artificial filament;
Removing the mask layer;
Establishing a second electrode structure; and
Annealing the junction region, thereby activating the mobile species.

According to the first aspect of the present embodiment, prior to implanting, the material is essentially undoped or has low concentration of dopants, and wherein subsequent to implanting, the doping species are doping the material to form the mobile species and thus higher doped and higher conducting spatially-localized region of the material that thereby form an artificial filament.

According to the second aspect of the present embodiment, prior to implanting, the material contains dopants, and wherein subsequent to implanting, the mobile species passivates at least some of the dopants in the material to form less doped and less conducting region around the spatially-localized region of the material with higher concentration of dopants that thereby form an artificial filament.

Utilization of ion implantation process to form a three-dimensionally localized artificial filament will not only improve the quality of the interfaces compared to the realization with physical structuring of the interfaces but also will enable the formation of the artificial filament through the electrode structure, thus providing the opportunity for deposition of all the layers involved in resistive switching (bottom electrode, active layer and top electrode) either in a single deposition process (without breaking the vacuum), or with two deposition processes. The formation of an artificial filament will either minimize or completely eliminate the naturally unrepeatable electroforming process, which is shown to be one of the main reasons for variations in operational parameters between individual devices and in the same devices between different set and reset processes. The disclosed fabrication method will minimize the variations in interfaces, another critical parameter causing significant unrepeatability and unreliability in memristive devices to date. Utilization of ion implantation of the active layer through the top electrode enable the CMOS-compatible fabrication process capable of addressing both of repeatability and reliability issues simultaneously. It should be noted that electron irradiation can be used instead of ion implantation for some of the materials and thus also falling under the present invention.

BRIEF DESCRIPTION OF THE DRAWINGS

These and other features and advantages of presently preferred non-limiting illustrative exemplary embodiments will be better and more completely understood by referring to the following detailed description in connection with the drawings, of which.

DESCRIPTION OF THE INVENTION

Figure 1:
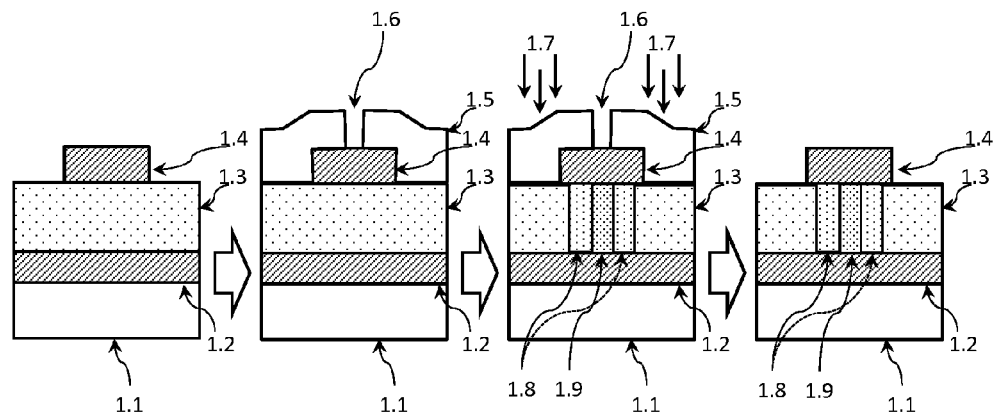
FIG. 1A through FIG. 1D are semi-schematic cross-sectional views of the first aspect of the first embodiment of a method for forming a single memristive device of the present invention.

According to the first aspect of the first embodiment of the present invention, schematically illustrated in FIG. 1A-D, a method of forming the memristive device on the substrate 1.1 comprises: establishing the first electrode 1.2 on at least a portion of the substrate 1.1; establishing the material 1.3 on the at least the portion of the first electrode 1.2; establishing the second electrode 1.4 on at least a portion of the material 1.3 thus forming a junction, establishing a mask layer 1.5 on the top of at least the portion of the second electrode 1.4 with at least one opening 1.6 over the portion of the junction region; implanting a predetermined doping species 1.7 into a portion of the material 1.9 that is unmasked by the mask layer 1.5, thereby forming an artificial filament 1.9; removing the mask layer 1.5; and annealing the junction region, thereby activating the mobile species.

The substrate 1.1 according to the present embodiment can comprise a silicon wafer with insulating layer on the top, or it can comprise the semiconductor wafer with already formed electrical or optical circuitry.

The electrodes 1.2 and 1.4 may comprise one or more layers of suitable conducting material (for a nonlimiting example, platinum, copper, platinum/titanium bilayer, nickel/platinum bilayer, copper/titanium nitride bilayer, platinum/molybdenum bilayer, gold, silver, etc.) and may have any have any suitable thickness (for a nonlimiting example, in the range from about 5 nm to about 100 nm). It is to be understood that the material and thickness of the electrodes 1.2 and 1.4 may be varied as is desirable to achieve one or more particular device properties. Moreover, electrodes 1.2 and 1.4 may be made of different materials and have different thicknesses. The electrodes 1.2 and 1.4 may be structured in the shape desired by the particular application and may have many different widths or cross-sections, aspect ratios and orientations with respect to each other and with respect to the substrate.

The electrodes 1.2 and 1.4 may be fabricated by a combination of conventional deposition technique and conventional lithography technique. The conventional deposition technique, for a nonlimiting example, can comprise physical deposition (magnetron sputtering, thermal evaporation, electron beam evaporation or any other physical deposition technique known to those skilled in the art), plating (electroplating or electroless plating), the combination of the listed techniques or other deposition method known to those skilled in the art. Alternatively, the bottom electrode structure 1.2 can be made from one or more layers of highly doped semiconductors fabricated by ion implantation of the substrate. The conventional lithography technique, for a nonlimiting example, can comprise photolithography, electron beam lithography, imprint lithography.

The material 1.3, which also sometimes called in this invention an "active layer," may comprise one or more thin (below 100 nm in thickness) layers of materials selected from the group consisted of oxides (e.g. $TiO_2$, $HfO_2$, $SiO_2$, etc.), sulphides (CdS, PbS, ZnS, etc.), selenides (CdSe, etc.), nitrides ($Si_3N_4$, TiN, etc.), phosphites, arsenides, chlorides, semiconductor halides and bromides of the transition and rare earth metals, with the alkaline earth metals optionally being present in compounds. Further, various alloys and mixed compounds, in which two or more different metal atoms combined with some number of the electronegative elements may be used for one or more layers comprising material 1.3. The material 1.3 may comprise one or more layers of stochiometric compounds (for nonlimiting examples, $TiO_2$, $ZrO_2$, $HfO_2$, $SrTiO_3$, CuO, NiO, GaN, CuCl). Alternatively, the active layer may comprise one or more layers of nonstochiometric compounds (for nonlimiting examples $TiO_{2-x}$, $ZrO_{2-x}$, $CuO_x$, $NiO_x$, $HfO_{2-x}$, $SrTiO_{3-x}$, $GaN_{1-x}$, $CuCl_{1-x}$) made by, for a nonlimiting example, reactive magnetron sputtering in some oxygen pressure in the deposition chamber, or by other techniques known to those skilled in the art. According to this aspect of the first embodiment of the present invention the material 1.3 as formed is essentially undoped or has low doping resulting in low conductance and high resistivity.

Once the material 1.3 is established, the second electrode 1.4 is positioned thereon, thus forming the junction, i.e., the area where the material 1.3 is at the same time covering the portion of the first electrode 1.2 and is being covered by the portion of the second electrode 1.4. It is to be understood that the $1^{st}$ and $2^{nd}$ electrode should be electrically insulated from each other and should not have a conductive path between each other aside of through the material 1.3.

Referring now specifically to FIG. 1B the mask layer 1.5 is being formed on the top of at least the portion of the second electrode 1.4 with at least one opening 1.6 over the portion of the junction region. The mask layer 1.5 may be a layer of conventional photoresist and may be formed by conventional photolithography technique. Alternatively, the mask layer 1.5 can be a layer of inorganic material initially deposited by an appropriate deposition technique on the top of the second electrode 1.4 and then structured to form an opening 1.6 by a combination of conventional photolithography technique and etching technique (such as, for a nonlimiting example chemical etching, reactive ion etching or ion milling). Still alternatively, the mask layer 1.5 may be the portion of the second electrode 1.4 and the opening 1.6 may be formed by a combination of conventional photolithography and conventional etching technique. The opening 1.6 may have suitable lateral dimensions (cross-section preferably in the range of 5 nm and 50 nm) and suitable vertical extent (preferably in the range of 5 nm and 100 nm).

Referring now specifically to FIG. 1C, the memristive device structure with the mask layer is exposed to an implantation process. During this process, a doping species is implanted into a through the depth of the portion of second electrode 1.4 and at least a portion of the thickness of the material 1.3, exposed through the opening 1.6. The mask material 1.5 acts as a mask to the implanted doping species. As such, the portion of the memristive device structure underlying the mask layer 1.5 outside of the opening 1.6 remains unexposed to the doping species after implantation is complete. The implantation process parameters (e.g., energy and dosage) and the thicknesses of the masking layer 1.5 and second electrode 1.4 should be chosen such as the doping species will be implanted into material 1.3 through the second electrode 1.4.

The doping species 1.7 implanted into the exposed portions of the material 1.3 is any suitable species that in combination with the material 1.3 will form mobile species in the laterally confined portion of the material 1.3, thus forming an artificial filament, or current conducting channel, 1.9. More specifically, the species implanted into the exposed portions of the material 1.3 is any suitable species that will, in combination with the material 1.3, generate a more conducting (less stoichiometric material) and will form the current conducting channel 1.9 in the center of the junction. In an illustrative example, the dosage and energy of the implantation may be chosen such as the conductivity in the conducting channel 1.9 is by four orders of magnitude or more higher than that of the unimplanted portion of the material 1.3.

The particular mobile species will depend in part on the material 1.3: in the nonlimiting example, the material 1.3 is $TiO_2$, and the doping species is Ti ions and the formed thus mobile species are then oxygen vacancies or metal interstitials. Similar doping and mobile species can be listed for other materials as well, for a nonlimiting example, for metal oxides the doping species should be ions of the metal comprising metal oxide and the mobile species will thus be oxygen vacancies, for metal nitrides the doping species should be ions of metal comprising metal nitride and the mobile species will thus be nitrogen vacancies and so on.

Referring now to FIG. 1D, the mask layer 1.5 is then removed and the memristive device is exposed to annealing for a predetermined time at a predetermined atmosphere and temperature profile. Annealing causes the formed by implantation mobile species to activate, and in some instances, to diffuse out of the channel 1.9 thus forming a less conductive portion 1.8 of the material, surrounding the channel. The temperature and time for annealing may vary depending on the material 1.3, mobile species used, a suitable thermal budget, the size of the opening, the thicknesses of the electrodes 1.2 and 1.4, and the material 1.3. The annealing may be accomplished in a tube furnace, or using a flash lamp or pulsed laser.

The resulting memristive device thus includes the conduction channel 1.9 having a desirable cross-section and extending between two electrodes 1.2 and 1.4 in a center portion of the junction. The resultant device may be switched between the ON and OFF states by applying appropriate voltages across the junctions in order to drive the mobile species vertically through the conduction channel.

According to the second aspect of the first embodiment of the present invention, schematically illustrated in FIG. 2A-D, a method of forming the memristive device on the substrate 2.1 comprises: establishing the first electrode 2.2 on at least a portion of the substrate 2.1; establishing the material 2.3 on the at least the portion of the first electrode 2.2; establishing the second electrode 2.4 on at least a portion of the material 2.3 thus forming a junction, establishing a mask layer 2.5 on the top of at least the portion of the second electrode 2.4 in the form of spatially-localized feature over the portion of the junction region; implanting a predetermined mobile species 2.6 into a portion of the material 2.3 that is unmasked by the mask layer 2.5, thereby forming an artificial filament 2.8; removing the mask layer 2.5; and annealing the junction region, thereby activating the mobile species.

The substrate 2.1 according to the present aspect can comprise a silicon wafer with insulating layer on the top, or it can comprise the semiconductor wafer with already formed electrical or optical circuitry.

The electrodes 2.2 and 2.4 may comprise one or more layers of suitable conducting material (for a nonlimiting example, platinum, copper, platinum/titanium bilayer, nickel/platinum bilayer, copper/titanium nitride bilayer, platinum/molybdenum bilayer, gold, silver, etc.) and may have any have any suitable thickness (for a nonlimiting example, in the range from about 5 nm to about 100 nm). It is to be understood that the material and thickness of the electrodes 2.2 and 2.4 may be varied as is desirable to achieve one or more particular device properties. Moreover, electrodes 2.2 and 2.4 may be made of different materials and have different thicknesses. The electrodes 2.2 and 2.4 may be structured in the shape desired by the particular application and may have many different widths or cross-sections, aspect ratios and orientations with respect to each other and with respect to the substrate.

The electrodes 2.2 and 2.4 may be fabricated by a combination of conventional deposition technique and conventional lithography technique. The conventional deposition technique, for a nonlimiting example, can comprise physical deposition (magnetron sputtering, thermal evaporation, electron beam evaporation or any other physical deposition technique known to those skilled in the art), plating (electroplating or electroless plating), the combination of the listed techniques or other deposition method known to those skilled in the art. Alternatively, the bottom electrode structure 2.2 can be made from one or more layers of highly doped semiconductors fabricated by ion implantation of the substrate. The conventional lithography technique, for a nonlimiting example, can comprise photolithography, electron beam lithography, imprint lithography.

The material 2.3, which also sometimes called in this invention an "active layer," may comprise one or more thin (below 100 nm in thickness) layers of materials selected from the group consisted of oxides (e.g. $TiO_2$, $HfO_2$, $SiO_2$, etc.), sulphides (CdS, PbS, ZnS, etc.), selenides (CdSe, etc.), nitrides ($Si_3N_4$, TiN, etc.), phosphites, arsenides, chlorides, semiconductor halides and bromides of the transition and rare earth metals, with the alkaline earth metals optionally being present in compounds. Further, various alloys and mixed compounds, in which two or more different metal atoms combined with some number of the electronegative elements may be used for one or more layers comprising material 2.3. The material 2.3 may comprise one or more layers of stochiometric compounds (for nonlimiting examples, $TiO_2$, $ZrO_2$, $HfO_2$, $SrTiO_3$, CuO, NiO, GaN, CuCl). Alternatively, the active layer 2.3 may comprise one or more layers of nonstochiometric compounds (for nonlimiting examples $TiO_{2-x}$, $ZrO_{2-x}$, $CuO_x$, $NiO_x$, $HfO_{2-x}$, $SrTiO_{3-x}$, $GaN_{1-x}$, $CuCl_{1-x}$) made by, for a nonlimiting example, reactive magnetron sputtering in some oxygen pressure in the deposition chamber, or by other techniques known to those skilled in the art. According to this aspect of the first embodiment of the present invention the material 2.3 as formed is doped resulting in some nonzero conductance and adequate resistivity.

Once the material 2.3 is established, the second electrode 2.4 is positioned thereon, thus forming the junction, i.e., the area where the material 2.3 is at the same time covering the portion of the first electrode 2.2 and is being covered by the portion of the second electrode 2.4. It is to be understood that the electrodes 2.2 and 2.4 should be electrically insulated from each other and should not have a conductive path between each other aside of through the material 2.3.

Figure 2:
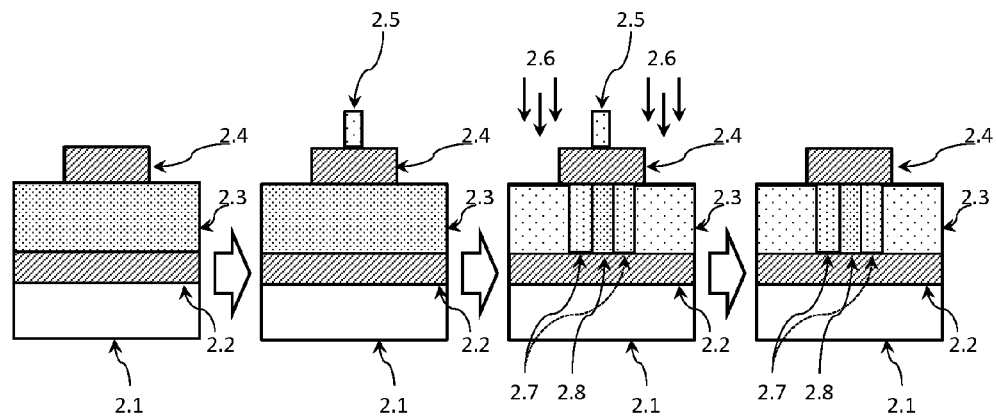
FIG. 2A through FIG. 2D are semi-schematic cross-sectional views of the second aspect of the first embodiment of a method for forming a single memristive device of the present invention.

Referring now specifically to FIG. 2B the mask layer 2.5 is being formed on the top of the portion of the second electrode 2.4 in the form of spatially-localized feature over the portion of the junction region. The mask layer 2.5 may be a layer of conventional photoresist and may be formed by conventional photolithography technique. Alternatively, the mask layer 2.5 can be a layer of inorganic material initially deposited by an appropriate deposition technique on the top of the second electrode 2.4 and then structured by a combination of conventional photolithography technique and etching technique (such as, for a nonlimiting example chemical etching, reactive ion etching or ion milling). Still alternatively, the mask layer 2.5 may be the portion of the second electrode 2.4 and the feature 2.5 may be formed by a combination of conventional photolithography and conventional etching technique. The spatially localized feature 2.5 may have suitable lateral dimensions (cross-section preferably in the range of 5 nm and 50 nm) and suitable vertical extent (preferably in the range of 5 nm and 100 nm).

Referring now specifically to FIG. 2C, the memristive device structure with the mask layer is exposed to an implantation process. During this process, a mobile species is implanted into a through the depth of the portion of second electrode 2.4 and at least a portion of the thickness of the material 2.3. The mask material 2.5 acts as a mask to the implanted doping species. As such, the portion of the memristive device structure underlying the mask layer 2.5 remains unexposed to the mobile species after implantation is complete. The implantation process parameters (e.g., energy and dosage) and the thicknesses of the masking layer 2.5 and second electrode 2.4 should be chosen such as the mobile species will be implanted into material 2.3 through the second electrode 2.4.

The mobile species 2.6 implanted into the exposed portions of the material 2.3 is any suitable species that in combination with the material 2.3 will form lower doped region (and thus more insulating region) around the laterally confined masked by mask layer 2.5 portion of the material 2.3, thus forming an artificial filament, or current conducting channel, 2.8. More specifically, the species implanted into the exposed portions of the material 2.3 is any suitable species that will, in combination with the material 2.3, generate a more insulating (more stoichiometric material) and will confine the current conducting channel 2.8 (which is more non-stochiometric) in the center of the junction. In an illustrative example, the dosage and energy of the implantation may be chosen such as the conductivity in the conducting channel 2.8 is by four orders of magnitude or more higher than that of the implanted portion of the material 2.3.

The particular mobile species will depend in part on the material 2.3: in the nonlimiting example, the material 2.3 is $TiO_{2-x}$, where $x \leq 2$, and the mobile species includes oxygen ions generated using oxygen gas ($O_2$). The implanted mobile species reacts with the material 2.3 which is initially rich in oxygen vacancies (which serve as dopants during memristive device operation), and the implanted mobile species eliminates (i.e., passives) such vacancies in the exposed to ion implantation areas. Similar mobile species can be listed for other materials as well, for a nonlimiting example, for metal oxides the mobile species should be oxygen ions, for metal nitrides the doping species should be nitrogen ions and so on.

Referring now to FIG. 2D, the mask layer 2.5 is then removed and the memristive device is exposed to annealing for a predetermined time at a predetermined atmosphere and temperature profile. Annealing causes the formed by implantation mobile species to activate, and in some instances, to diffuse into the portion of material 2.3 that is unexposed to the species after implantation, thus effectively shrinking the width of the channel 2.8 to a desirable size, thus forming a less conductive portion 2.7 of the material, surrounding the channel. The temperature and time for annealing may vary depending on the material 2.3, mobile species used, a suitable thermal budget, the size of the opening, the thicknesses of the electrodes 2.2 and 2.4, and the material 2.3. The annealing may be accomplished in a tube furnace, or using a flash lamp or pulsed laser.

The resulting memristive device thus includes the conduction channel 2.9 having a desirable cross-section and extending between two electrodes 2.2 and 2.4 in a center portion of the junction. The resultant device may be switched between the ON and OFF states by applying appropriate voltages across the junctions in order to drive the mobile species vertically through the conduction channel.

According to the first aspect of the second embodiment of the present invention, schematically illustrated in FIG. 3A-D, a method of forming the memristive device on the substrate 3.1 comprises: establishing the first electrode 3.2 on at least a portion of the substrate 3.1; establishing the material 3.3 on the at least the portion of the first electrode 3.2; establishing the second electrode material 3.4 on at least a portion of the material 3.3 thus forming a junction, establishing a mask layer 3.5 on the top of at least the portion of the second electrode material 3.4 with at least one opening 3.6 over the portion of the junction region; implanting a predetermined doping species 3.7 into a portion of the material 3.8 that is unmasked by the mask layer 3.5, thereby forming an artificial filament 3.8; removing the mask layer 3.5; establishing a second electrode structure; and annealing the junction region, thereby activating the mobile species.

The substrate 3.1 according to the present embodiment can comprise a silicon wafer with insulating layer on the top, or it can comprise the semiconductor wafer with already formed electrical or optical circuitry.

The electrodes 3.2 and 3.4 may comprise one or more layers of suitable conducting material (for a nonlimiting example, platinum, copper, platinum/titanium bilayer, nickel/platinum bilayer, copper/titanium nitride bilayer, platinum/molybdenum bilayer, gold, silver, etc.) and may have any have any suitable thickness (for a nonlimiting example, in the range from about 5 nm to about 100 nm). It is to be understood that the material and thickness of the electrodes 3.2 and 3.4 may be varied as is desirable to achieve one or more particular device properties. Moreover, electrodes 3.2 and 3.4 may be made of different materials and have different thicknesses. The electrodes 3.2 and 3.4 may be structured in the shape desired by the particular application and may have many different widths or cross-sections, aspect ratios and orientations with respect to each other and with respect to the substrate.

The electrodes 3.2 and 3.4 may be fabricated by a combination of conventional deposition technique and conventional lithography technique. The conventional deposition technique, for a nonlimiting example, can comprise physical deposition (magnetron sputtering, thermal evaporation, electron beam evaporation or any other physical deposition technique known to those skilled in the art), plating (electroplating or electroless plating), the combination of the listed techniques or other deposition method known to those skilled in the art. Alternatively, the bottom electrode structure 3.2 can be made from one or more layers of highly doped semiconductors fabricated by ion implantation of the substrate. The conventional lithography technique, for a nonlimiting example, can comprise photolithography, electron beam lithography, imprint lithography.

The material 3.3, which also sometimes called in this invention an "active layer," may comprise one or more thin (below 100 nm in thickness) layers of materials selected from the group consisted of oxides (e.g. $TiO_2$, $HfO_2$, $SiO_2$, etc.), sulphides (CdS, PbS, ZnS, etc.), selenides (CdSe, etc.), nitrides ($Si_3N_4$, TiN, etc.), phosphites, arsenides, chlorides, semiconductor halides and bromides of the transition and rare earth metals, with the alkaline earth metals optionally being present in compounds. Further, various alloys and mixed compounds, in which two or more different metal atoms combined with some number of the electronegative elements may be used for one or more layers comprising material 3.3. The material 3.3 may comprise one or more layers of stochiometric compounds (for nonlimiting examples, $TiO_2$, $ZrO_2$, $HfO_2$, $SrTiO_3$, CuO, NiO, GaN, CuCl). Alternatively, the active layer may comprise one or more layers of nonstochiometric compounds (for nonlimiting examples $TiO_{2-x}$, $ZrO_{2-x}$, $CuO_x$, $NiO_x$, $HfO_{2-x}$, $SrTiO_{3-x}$, $GaN_{1-x}$, $CuCl_{1-x}$) made by, for a nonlimiting example, reactive magnetron sputtering in some oxygen pressure in the deposition chamber, or by other techniques known to those skilled in the art. According to this aspect of the second embodiment of the present invention the material 3.3 as formed is essentially undoped or has low doping resulting in low conductance and high resistivity.

Once the material 3.3 is established, the second electrode material 3.4 is positioned thereon. It is to be understood that the $1^{st}$ and $2^{nd}$ electrode should be electrically insulated from each other and should not have a conductive path between each other aside of through the material 3.3.

Figure 3:
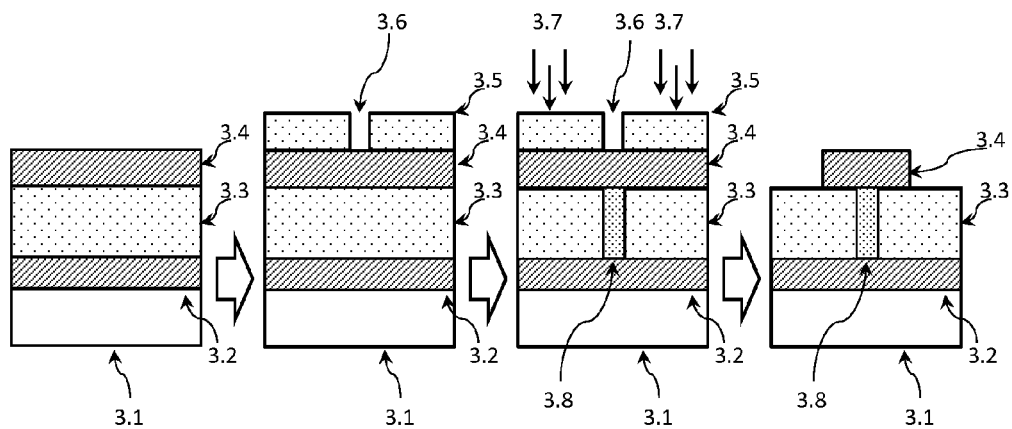
FIG. 3A through FIG. 3D are semi-schematic cross-sectional views of the first aspect of the second embodiment of a method for forming a single memristive device of the present invention.

Referring now specifically to FIG. 3B the mask layer 3.5 is being formed on the top of at least the portion of the second electrode material 3.4 with at least one opening 3.6 over the portion of the junction region. The mask layer 3.5 may be a layer of conventional photoresist and may be formed by conventional photolithography technique. Alternatively, the mask layer 3.5 can be a layer of inorganic material initially deposited by an appropriate deposition technique on the top of the second electrode material 3.4 and then structured to form an opening 3.6 by a combination of conventional photolithography technique and etching technique (such as, for a nonlimiting example chemical etching, reactive ion etching or ion milling). Still alternatively, the mask layer 3.5 may be the portion of the second electrode material 3.4 and the opening 3.6 may be formed by a combination of conventional photolithography and conventional etching technique. The opening 3.6 may have suitable lateral dimensions (cross-section preferably in the range of 5 nm and 50 nm) and suitable vertical extent (preferably in the range of 5 nm and 100 nm).

Referring now specifically to FIG. 3C, the memristive device structure with the mask layer is exposed to an implantation process. During this process, a doping species is implanted into a through the depth of the portion of second electrode material 3.4 and at least a portion of the thickness of the material 3.3, exposed through the opening 3.6. The mask material 3.5 acts as a mask to the implanted doping species. As such, the portion of the memristive device structure underlying the mask layer 3.5 outside of the opening 3.6 remains unexposed to the doping species after implantation is complete. The implantation process parameters (e.g., energy and dosage) and the thicknesses of the masking layer 3.5 and second electrode 3.4 should be chosen such as the doping species will be implanted into material 3.3 through the second electrode material 3.4.

The doping species 3.7 implanted into the exposed portions of the material 3.3 is any suitable species that in combination with the material 3.3 will form mobile species in the laterally confined portion of the material 3.3, thus forming an artificial filament, or current conducting channel, 3.8. More specifically, the species implanted into the exposed portions of the material 3.3 is any suitable species that will, in combination with the material 3.3, generate a more conducting (less stoichiometric material) and will form the current conducting channel 3.8 in the center of the junction. In an illustrative example, the dosage and energy of the implantation may be chosen such as the conductivity in the conducting channel 3.8 is by four orders of magnitude or more higher than that of the unimplanted portion of the material 3.3.

The particular mobile species will depend in part on the material 3.3: in the nonlimiting example, the material 3.3 is $TiO_2$, and the doping species is Ti ions and the formed thus mobile species are then oxygen vacancies or metal interstitials. Similar doping and mobile species can be listed for other materials as well, for a nonlimiting example, for metal oxides the doping species should be ions of the metal comprising metal oxide and the mobile species will thus be oxygen vacancies, for metal nitrides the doping species should be ions of metal comprising metal nitride and the mobile species will thus be nitrogen vacancies and so on.

Referring now to FIG. 3D, the mask layer 3.5 is then removed, the second electrode material 3.4 is then structured by a combination of common lithography and common etching techniques, and the memristive device is exposed to annealing for a predetermined time at a predetermined atmosphere and temperature profile. Annealing causes the formed by implantation mobile species to activate, and in some instances, to diffuse out of the channel 3.8 thus forming a less conductive portion of the material, surrounding the channel. The temperature and time for annealing may vary depending on the material 3.3, mobile species used, a suitable thermal budget, the size of the opening, the thicknesses of the electrodes 3.2 and 3.4, and the material 3.3. The annealing may be accomplished in a tube furnace, or using a flash lamp or pulsed laser.

It should be noted that second electrode material can be structured to form second electrode 3.4 after the annealing process if it is advantageous for the memristive device fabrication.

The resulting memristive device thus includes the conduction channel 3.8 having a desirable cross-section and extending between two electrodes 3.2 and 3.4 in a center portion of the junction. The resultant device may be switched between the ON and OFF states by applying appropriate voltages across the junctions in order to drive the mobile species vertically through the conduction channel.

According to the second aspect of the second embodiment of the present invention, schematically illustrated in FIG. 4A-D, a method of forming the memristive device on the substrate 4.1 comprises: establishing the first electrode 4.2 on at least a portion of the substrate 4.1; establishing the material 4.3 on the at least the portion of the first electrode 4.2; establishing the second electrode material 4.4 on at least a portion of the material 4.3 thus forming a junction, establishing a mask layer 4.5 on the top of at least the portion of the second electrode material 4.4 in the form of spatially-localized feature over the portion of the junction region; implanting a predetermined mobile species 4.6 into a portion of the material 4.3 that is unmasked by the mask layer 4.5, thereby forming an artificial filament 4.8; removing the mask layer 4.5; establishing the second electrode structure and annealing the junction region, thereby activating the mobile species.

The substrate 4.1 according to the present aspect can comprise a silicon wafer with insulating layer on the top, or it can comprise the semiconductor wafer with already formed electrical or optical circuitry.

The electrodes 4.2 and 4.4 may comprise one or more layers of suitable conducting material (for a nonlimiting example, platinum, copper, platinum/titanium bilayer, nickel/platinum bilayer, copper/titanium nitride bilayer, platinum/molybdenum bilayer, gold, silver, etc.) and may have any suitable thickness (for a nonlimiting example, in the range from about 5 nm to about 100 nm). It is to be understood that the material and thickness of the electrodes 4.2 and 4.4 may be varied as is desirable to achieve one or more particular device properties. Moreover, electrodes 4.2 and 4.4 may be made of different materials and have different thicknesses. The electrodes 4.2 and 4.4 may be structured in the shape desired by the particular application and may have many different widths or cross-sections, aspect ratios and orientations with respect to each other and with respect to the substrate.

The electrodes 4.2 and 4.4 may be fabricated by a combination of conventional deposition technique and conventional lithography technique. The conventional deposition technique, for a nonlimiting example, can comprise physical deposition (magnetron sputtering, thermal evaporation, electron beam evaporation or any other physical deposition technique known to those skilled in the art), plating (electroplating or electroless plating), the combination of the listed techniques or other deposition method known to those skilled in the art. Alternatively, the bottom electrode structure 4.2 can be made from one or more layers of highly doped semiconductors fabricated by ion implantation of the substrate. The conventional lithography technique, for a nonlimiting example, can comprise photolithography, electron beam lithography, imprint lithography.

The material 4.3, which also sometimes called in this invention an "active layer," may comprise one or more thin (below 100 nm in thickness) layers of materials selected from the group consisted of oxides (e.g. $TiO_2$, $HfO_2$, $SiO_2$, etc.), sulphides (CdS, PbS, ZnS, etc.), selenides (CdSe, etc.), nitrides ($Si_3N_4$, TiN, etc.), phosphites, arsenides, chlorides, semiconductor halides and bromides of the transition and rare earth metals, with the alkaline earth metals optionally being present in compounds. Further, various alloys and mixed compounds, in which two or more different metal atoms combined with some number of the electronegative elements may be used for one or more layers comprising material 4.3. The material 4.3 may comprise one or more layers of stochiometric compounds (for nonlimiting examples, $TiO_2$, $ZrO_2$, $HfO_2$, $SrTiO_3$, CuO, NiO, GaN, CuCl). Alternatively, the active layer 4.3 may comprise one or more layers of nonstochiometric compounds (for nonlimiting examples $TiO_{2-x}$, $ZrO_{2-x}$, $CuO_x$, $NiO_x$, $HfO_{2-x}$, $SrTiO_{3-x}$, $GaN_{1-x}$, $CuCl_{1-x}$) made by, for a nonlimiting example, reactive magnetron sputtering in some oxygen pressure in the deposition chamber, or by other techniques known to those skilled in the art. According to this aspect of the first embodiment of the present invention the material 4.3 as formed is doped resulting in some nonzero conductance and adequate resistivity.

Once the material 4.3 is established, the second electrode material 4.4 is positioned thereon, thus forming the junction. It is to be understood that the electrodes 4.2 and 4.4 should be electrically insulated from each other and should not have a conductive path between each other aside of through the material 4.3.

Figure 4:
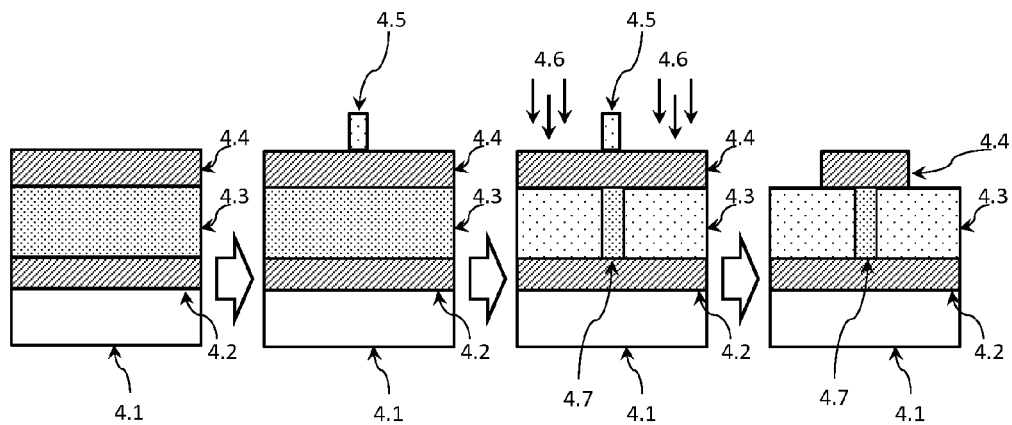
FIG. 4A through FIG. 4D are semi-schematic cross-sectional views of the second aspect of the second embodiment of a method for forming a single memristive device of the present invention.

Referring now specifically to FIG. 4B the mask layer 4.5 is being formed on the top of the portion of the second electrode material 4.4 in the form of spatially-localized feature over the portion of the junction region. The mask layer 4.5 may be a layer of conventional photoresist and may be formed by conventional photolithography technique. Alternatively, the mask layer 4.5 can be a layer of inorganic material initially deposited by an appropriate deposition technique on the top of the second electrode material 4.4 and then structured by a combination of conventional photolithography technique and etching technique (such as, for a nonlimiting example chemical etching, reactive ion etching or ion milling). Still alternatively, the mask layer 4.5 may be the portion of the second electrode material 4.4 and the feature 4.5 may be formed by a combination of conventional photolithography and conventional etching technique. The spatially localized feature 4.5 may have suitable lateral dimensions (cross-section preferably in the range of 5 nm and 50 nm) and suitable vertical extent (preferably in the range of 5 nm and 100 nm).

Referring now specifically to FIG. 4C, the memristive device structure with the mask layer is exposed to an implantation process. During this process, a mobile species is implanted into a through the depth of the portion of second electrode material 4.4 and at least a portion of the thickness of the material 4.3. The mask material 4.5 acts as a mask to the implanted doping species. As such, the portion of the memristive device structure underlying the mask layer 4.5 remains unexposed to the mobile species after implantation is complete. The implantation process parameters (e.g., energy and dosage) and the thicknesses of the masking layer 4.5 and second electrode 4.4 should be chosen such as the mobile species will be implanted into material 4.3 through the second electrode 4.4.

The mobile species 4.6 implanted into the exposed portions of the material 4.3 is any suitable species that in combination with the material 4.3 will form lower doped region (and thus more insulating region) around the laterally confined masked by mask layer 4.5 portion of the material 4.3, thus forming an artificial filament, or current conducting channel, 4.7. More specifically, the species implanted into the exposed portions of the material 4.3 is any suitable species that will, in combination with the material 4.3, generate a more insulating (more stoichiometric material) and will confine the current conducting channel 4.7 (which is more non-stochiometric) in the center of the junction. In an illustrative example, the dosage and energy of the implantation may be chosen such as the conductivity in the conducting channel 4.7 is by four orders of magnitude or more higher than that of the implanted portion of the material 4.3.

The particular mobile species will depend in part on the material 4.3: in the nonlimiting example, the material 4.3 is $TiO_{2-x}$, where $x \leq 2$, and the mobile species includes oxygen ions generated using oxygen gas ($O_2$). The implanted mobile species reacts with the material 4.3 which is initially rich in oxygen vacancies (which serve as dopants during memristive device operation), and the implanted mobile species eliminates (i.e., passives) such vacancies in the exposed to ion implantation areas. Similar mobile species can be listed for other materials as well, for a nonlimiting example, for metal oxides the mobile species should be oxygen ions, for metal nitrides the doping species should be nitrogen ions and so on.

Referring now to FIG. 4D, the mask layer 4.5 is then removed, the second electrode material 4.4 is then structured by a combination of common lithography and common etching techniques and the memristive device is exposed to annealing for a predetermined time at a predetermined atmosphere and temperature profile. Annealing causes the formed by implantation mobile species to activate, and in some instances, to diffuse into the portion of material 4.3 that is unexposed to the species after implantation, thus effectively shrinking the width of the channel 4.7 to a desirable size. The temperature and time for annealing may vary depending on the material 4.3, mobile species used, a suitable thermal budget, the size of the opening, the thicknesses of the electrodes 4.2 and 4.4, and the material 4.3. The annealing may be accomplished in a tube furnace, or using a flash lamp or pulsed laser.

It should be noted that second electrode material can be structured to form second electrode 4.4 after the annealing process if it is advantageous for the memristive device fabrication.

The resulting memristive device thus includes the conduction channel 4.7 having a desirable cross-section and extending between two electrodes 4.2 and 4.4 in a center portion of the junction. The resultant device may be switched between the ON and OFF states by applying appropriate voltages across the junctions in order to drive the mobile species vertically through the conduction channel.

Formation of artificial element (or three-dimensionally localized conductive channel in the junction region) according to the various aspects of the present invention may either eliminate electroforming step completely or direct the electroforming process, thus substantially reducing the nonrepeatability of electroforming process, thus resulting in improved yield and performance of memristive devices. Moreover, implantation of the active layer through the top electrode permits at the same time keeping active layer/top electrode interface pristine (since the deposition of both active layer and second electrode material can be carried out without breaking the vacuum) while providing adequate control over the position and three-dimensional localization of the artificial filament in the junction area.

The memristive device of the present invention can be used in data storage applications, signal processing applications and sensing applications.

What is claimed is:

1. A method of forming the memristive device on the substrate, comprising a first electrode on the substrate; a second electrode, extending over at least a portion of the first electrode, thereby forming a junction region therebetween; an active layer material, established at least over the portion of the first electrode, said portion containing the junction region, a three-dimensionally localized artificial filament extending at least partially between the first electrode and the second electrode, and defined in portion of said material with controlled profile and density of dopants different from the density of dopants in at least some other portion of said material, the method comprising:

Establishing the first electrode on at least a portion of the substrate;
Establishing the material on the at least the portion of the first electrode;
Establishing the second electrode on at least a portion of the material,
Establishing a mask layer on the top of at least the portion of the second electrode with at least one opening over the portion of the junction region;
Implanting a predetermined doping species into a portion of the material that is unmasked by the mask layer thus forming mobile species, thereby forming an artificial filament;
Removing the mask layer; and
Annealing the junction region, thereby activating the mobile species.

2. The method of claim 1, wherein prior to implanting, the material is essentially undoped or has low concentration of dopants, and wherein subsequent to implanting, the doping species are doping the material to form the mobile species and thus higher doped and higher conducting spatially-localized region of the material that thereby form an artificial filament.

3. The method of claim 1, wherein prior to implanting, the material contains dopants, and wherein subsequent to implanting, the doping species passivates at least some of the dopants in the material to form less doped and less conducting region around the spatially-localized region of the material with higher concentration of dopants that thereby form an artificial filament.

4. A method of forming the memristive device on the substrate, comprising a first electrode on the substrate; a second electrode, extending over at least a portion of the first electrode, thereby forming a junction region therebetween; an active layer material, established at least over the portion of the first electrode, said portion containing the junction region, a three-dimensionally localized artificial filament extending at least partially between the first electrode and the second electrode, and defined in portion of said material with controlled profile and density of dopants different from the density of dopants in at least some other portion of said material, the method comprising:

Establishing the first electrode on at least a portion of the substrate;
Establishing the material on the at least the portion of the first electrode;
Establishing the second electrode material on at least a portion of the material,
Establishing a mask layer on the top of at least the portion of the second electrode material with at least one opening over the portion of the junction region;
Implanting a predetermined doping species into a portion of the material that is unmasked by the mask layer thus forming mobile species, thereby forming an artificial filament;
Removing the mask layer;
Establishing a second electrode structure; and
Annealing the junction region, thereby activating the mobile species.

5. The method of claim 4, wherein prior to implanting, the material is essentially undoped or has low concentration of dopants, and wherein subsequent to implanting, the doping species are doping the material to form the mobile species and thus higher doped and higher conducting spatially-localized region of the material that thereby form an artificial filament.

6. The method of claim 4, wherein prior to implanting, the material contains dopants, and wherein subsequent to implanting, the mobile species passivates at least some of the dopants in the material to form less doped and less conducting region around the spatially-localized region of the material with higher concentration of dopants that thereby form an artificial filament.

* * * * *